United States Patent [19]
Masini et al.

[11] Patent Number: 5,798,672
[45] Date of Patent: Aug. 25, 1998

[54] SINGLE-OUTPUT DUAL-SUPPLY CLASS D AMPLIFIER

[75] Inventors: Marco Masini, Milan; Claudio Tavazzani, Pavia; Stefania Boiocchi, Certosa, all of Italy

[73] Assignee: SGS-Thomson Microelectronics S.r.l., Agrate Brianza, Italy

[21] Appl. No.: 678,515

[22] Filed: Jul. 9, 1996

[30] Foreign Application Priority Data

Jul. 13, 1995 [EP] European Pat. Off. .............. 95830301

[51] Int. Cl.$^6$ ................................................ H03F 3/217
[52] U.S. Cl. ........................ 330/251; 330/10; 330/149
[58] Field of Search ............................. 330/10, 207 A, 330/251, 149; 332/109

[56] References Cited

U.S. PATENT DOCUMENTS

| | | | |
|---|---|---|---|
| 3,386,046 | 5/1968 | Myer | 330/207 A X |
| 3,976,955 | 8/1976 | Hamada | 330/10 X |
| 5,113,158 | 5/1992 | Tsuji | 332/109 |
| 5,262,733 | 11/1993 | Nakajima et al. | 330/251 X |
| 5,289,502 | 2/1994 | Kawasaki | 375/62 |
| 5,412,349 | 5/1995 | Young et al. | 331/34 |

FOREIGN PATENT DOCUMENTS

| | | | |
|---|---|---|---|
| A-0 277 682 | 8/1988 | European Pat. Off. | ....... H03K 3/282 |
| A-0 503 571 | 9/1992 | European Pat. Off. | ....... H03F 3/217 |

OTHER PUBLICATIONS

European Search Report from European Patent Application 95830301.8, filed Jul. 13, 1995.

*Primary Examiner*—James B. Mullins
*Attorney, Agent, or Firm*—Wolf, Greenfield & Sacks, P.C.

[57] ABSTRACT

An amplifier is formed by an astable multivibrator having a signal output supplying a two-state output signal to a power stage, that presents an output voltage ($V_o$) switching between a first and second value. The output voltage presents a duty cycle varying with the input signal ($V_{in}$) of the multivibrator. The amplifier, when connected between first and second supply lines that are symmetrical with respect to ground and are subject to supply noise, comprises a current source for generating the bias current of the astable multivibrator and supplying a current (I) that is switchable at each half cycle. The value of the current at each half cycle is proportional to the absolute value of the output voltage ($V_o$) of the amplifier to vary the duty cycle of the amplifier in a manner correlated the supply noise, so that the average output voltage value is zero.

26 Claims, 4 Drawing Sheets

5,798,672

SINGLE-OUTPUT DUAL-SUPPLY CLASS D AMPLIFIER

BACKGROUND OF THE INVENTION

1. Field of the Invention

The present invention relates to a single-output dual-supply class D amplifier.

2. Discussion of the Related Art

As is known (see H. R. Camenzind's article: "Modulated Pulse Audio Power Amplifiers for Integrated Circuits", IEEE Transactions on Audio and Electroacoustics, Vol. XV-14, N.3, September 1966), class D amplifiers are two-state or pulse-width modulation types, the output voltage of which is a rail-to-rail square wave varying between two reference voltages (in the case of dual supply, between the two supply voltages), with a duty cycle varying according to the input signal. More specifically, and as shown in FIGS. 6 and 7 of the above article, a class D amplifier may be implemented by an astable multivibrator stage output-connected to a power stage, as shown in FIG. 1. In FIG. 1, the amplifier is indicated as a whole by 1, the astable multivibrator stage by 2, and the power stage by 3.

Multivibrator stage 2 comprises a pair of input transistors 5, 6, in this case, two bipolar NPN transistors with their emitter terminals connected and forming a common node 4. A current (I) source 7 is provided between node 4 and a ground line (reference potential line) 13. The base terminals of transistors 5 and 6 form the input terminals 8 and 9 of amplifier 1, between which an input voltage $V_{in}$ is supplied. The collector terminals of transistors 5 and 6 define nodes 10 and 11, between which is provided a capacitor 12. Node 10 is connected to the emitter terminal of an NPN transistor 14, the collector terminal of which is connected to node 15, and the base terminal of which is connected to node 16. Node 11 is connected to the emitter terminal of an NPN transistor 18, the collector terminal of which is connected to node 19, and the base terminal of which is connected to node 20. Bias current sources 21, 22 are provided, respectively, between nodes 16 and 20, and ground 13.

Node 15 is connected to a positive supply line 24 at voltage $V_{cc}$ via a resistor 25 and a diode 26 connected in parallel with each other. Similarly, node 19 is connected to supply line 24 via a resistor 27 and a diode 28 connected in parallel with each other. An NPN transistor 31 has the collector terminal connected to supply line 24, the base terminal connected to node 15, and the emitter terminal connected to node 20. A similar NPN transistor 32 has the collector terminal connected to supply line 24, the base terminal connected to node 19, and the emitter terminal connected to node 16. Nodes 15 and 19 form the differential output of multivibrator stage 2, and are connected to respective inputs 33, 34 of the power stage, which presents an output node 35. In the example shown, power stage 3 is a dual-supply type, and therefore has a pair of inputs nodes 36, 37 supplied with two symmetrical supply voltages $+V_{cc}$ and $-V_{cc}$.

With a zero input signal $V_{in}$, the circuit of FIG. 1 operates as follows. If transistor 18 is on and transistor 14 off, the bias current supplied by source 7 flows through transistor 18 and resistor 27, which therefore directly biases and turns on diode 28; the voltage at node 19 equals $V_{cc}-V_{BE}$ (where $V_{BE}$ is the voltage drop between the base and emitter of a turned-on NPN transistor, equal to the voltage drop across a diode, i.e. roughly 0.7 V); and the voltage at node 16 equals $V_{cc}-2V_{BE}$. As transistor 14 is off, and disregarding the base current of transistor 31, the voltage at node 15 equals $V_{cc}$; the voltage at node 20 equals $V_{cc}-V_{BE}$, and the voltage at node 11 equals $V_{cc}-2V_{BE}$. As input voltage $V_{in}$ is zero, the current through transistor 18 (equal to current I of source 7) is divided equally between transistor 6 and capacitor 12, and charges capacitor 12 to gradually reduce the voltage at node 10 in relation to that at node 11. When the voltage at node 10 equals $V_{cc}-3V_{BE}$, the voltage between the base and emitter of transistor 14 equals $V_{BE}$ and transistor 14 is turned on; then, the collector current of transistor 14 via resistor 25 causes a voltage drop over diode 26 such as to turn it on. Therefore, the voltage at node 15 is brought to $V_{cc}-V_{BE}$; the voltage at node 20 is brought to $V_{cc}-2V_{BE}$; transistor 18 is turned off (zero voltage drop between the base and emitter); diode 28 is turned off; the voltage at node 19 equals $V_{cc}$; the voltage at node 16 equals $V_{cc}-V_{BE}$; and the voltage at node 10 equals $V_{cc}-2V_{BE}$. The bias current I generated by source 7 now flows from transistor 14, and is divided equally between capacitor 12 and transistor 5. More specifically, the current through capacitor 12 flows in the opposite direction to before, and discharges the capacitor, the voltage $V_c$ of which falls linearly from $V_{BE}$ to $-V_{BE}$. As soon as voltage $V_c$ reaches $-V_{BE}$, so that node 11 equals $V_{cc}-3V_{BE}$, transistor 18 is turned on again to switch node 19 to $V_{cc}-V_{BE}$ and multivibrator stage 2 to the initial condition described.

At output nodes 15 and 19, multivibrator stage 2 therefore presents opposite phase voltages varying between two values, i.e. between $V_{cc}$ and $V_{cc}-V_{BE}$, and which are supplied to power stage 3, a non-limiting embodiment of which is shown in FIG. 2.

Power stage 3 in FIG. 2 comprises a pair of P-channel MOS input transistors 40 and 41, the gate terminals of which are connected respectively to nodes 33, 34. Transistors 40 and 41 are connected in a differential configuration, with the source terminals each connected to a current source 42, and the drain terminals connected to the drain terminals of respective N-channel MOS transistors 43 and 44. Transistors 43 and 44 are diode-connected (shorted drain and gate terminals), and have their source terminals connected to a line 45 presenting negative supply voltage $-V_{cc}$ and connected to input terminal 37. Transistors 43 and 44 form current mirrors with transistors 47 and 48, and 49 and 50, respectively, which are all N-channel MOS transistors with the source terminal connected to line 45. The drain terminal of transistor 47 forms a node 51 connected to the emitter terminal of an NPN transistor 52, to the drain terminal of a P-channel transistor 53, and to the input of an inverter 54. Transistor 52 has the collector terminal connected to a line 55, and the base terminal connected to the output 35 of power stage 3 and to a first terminal of a bootstrap capacitor 56, the second terminal of which is connected to line 55. Transistor 53 forms a current mirror with a diode-connected P-channel transistor 57, the source terminal of which is connected to line 55, and the drain terminal of which is connected to the drain terminal of transistor 50.

Transistor 48 has the drain terminal connected to the drain terminal of a diode-connected P-channel transistor 59, the source terminal of which is connected to a node 60, and which forms a current mirror with a P-channel transistor 61, the source terminal of which is also connected to node 60, and the drain terminal of which is connected to the drain terminal of transistor 49 and to one input of an inverter 62.

Inverter 54 has two bias inputs connected respectively to line 55 and to the base terminal of transistor 52, and has an output connected to the gate terminal of an N-channel power MOS transistor 64 forming the high-side output transistor. Inverter 62 has two bias inputs connected respectively to node 60 and to line 45, and has an output connected to the gate terminal of an N-channel power MOS transistor 65 forming the low-side output transistor. The intermediate node between the source terminal of transistor 64 and the drain terminal of transistor 65 forms the output 35 of the power stage. The source terminal of transistor 65 is connected to line 45, and the drain terminal of transistor 64 is connected to supply voltage $V_{cc}$. The circuit also comprises a regulated voltage source 68 between line 45 and node 60, and a diode 69 connected with its anode to node 60 and with its cathode to line 55.

Transistors 40 and 41 form a differential stage and are therefore turned on alternately. More specifically, when the voltage at input 33 is at $V_{cc}-V_{BE}$ and the voltage at node 34 is at $V_{cc}$, transistor 40 is on and transistor 41 off. Therefore, transistor 40 drives the current mirror formed by transistors 43, 47, 48, which are on. Node 51 is brought to a low voltage and the output of inverter 54 is high, so that transistor 64 is on and output voltage $V_o$ is high (around $V_{cc}$). Via transistor 48, transistors 59 and 61 are driven to supply a high voltage to the input of inverter 62; the output of inverter 62 is therefore low, and transistor 65 is off.

Conversely, when input 33 presents voltage $V_{cc}$ and input 34 presents voltage $V_{cc}-V_{BE}$, transistor 40 is off and transistor 41 is on. Transistors 44, 49, 50 are therefore on; the input of inverter 62 is low, its output is high, and power transistor 65 is on to bring output 35 to $-V_{cc}$. Transistor 50 drives the current mirror formed by transistors 53, 57, which are therefore on, and brings node 51 to the high voltage on line 55, and therefore transistor 64 is off.

In the FIG. 2 circuit, diode 69 and bootstrap capacitor 56 provide for charging capacitor 56 to the regulated voltage $V_{REG}$ generated by source 68 when output node 35 is low and transistor 64 is off, and ensure correct biasing of high-side transistor 64 in the opposite phase when the gate terminal of transistor 64 must be driven at a voltage higher than supply voltage $V_{cc}$ to ensure transistor 64 is turned on correctly and output 35 is latched to voltage $V_{cc}$.

Together, the FIG. 1 and 2 circuits therefore supply the voltages shown in FIG. 3, which shows a time plot of voltage $V_c$ (long dotted line) and output voltage $V_o$ (continuous line). In this case, the average output voltage value is zero.

Class D amplifiers of the type described previously present a lower feedback rate than linear amplifiers, so that supply noise rejection (i.e. the logarithmic ratio between the output voltage and noise in the supply voltage) is low. That is to say, any noise in the supply is reproduced in a corresponding noise in the output. This problem is more serious in the case of single-output amplifiers than in bridge ones, because in a bridge amplifier, supply noise may be rejected as common-mode noise.

Since feedback fails to sufficiently reject supply noise, recourse must be made to other types of compensation, e.g. feedforward compensation. This type of compensation, however, is complicated in the case of dual-supply amplifiers of the type in question, which require noise rejection of both supplies.

For example, the presence of an asymmetric supply $V_{cc}+\Delta V_{cc}$, $-V_{cc}$, i.e. of noise in the high supply voltage, causes a variation in the output voltage $V_o$ of the amplifier and in its average value. With reference to FIG. 3, such an asymmetric supply would give rise to the output voltage $V_o'$ shown by the dotted line and presenting an average value $V_{oAVE}=\Delta V_{cc}/2$, i.e. a rejection of only −6 dB.

SUMMARY OF THE INVENTION

It is an object of the present invention to provide a class D amplifier of the type described, designed to overcome the aforementioned drawback.

According to an embodiment of the invention, a single-output, dual-supply class D amplifier includes an astable multivibrator stage connected to a power stage. The astable multivibrator stage has a signal input to receive an input signal and a signal output to supply an output signal that varies between two states. The power stage receives the output signal from the astable multivibrator to generate an output voltage that switches between a first value and a second value, the output voltage having a duty cycle that is correlated with a value of the input signal. The output voltage is provided on an output terminal that forms the power output of the amplifier, the amplifier being connected to first and second supply lines and a reference potential line. The first and second supply lines provide symmetrical supply voltages in relation to the reference potential line and are subject to supply noise. The amplifier of this embodiment further includes means, coupled to the power output of the amplifier, for varying the duty cycle of the output voltage in a manner that is correlated with the supply noise.

BRIEF DESCRIPTION OF THE DRAWINGS

Preferred, non-limiting embodiments of the present invention are described by way of example with reference to accompanying drawings, in which.

DETAILED DESCRIPTION

Figure 1:
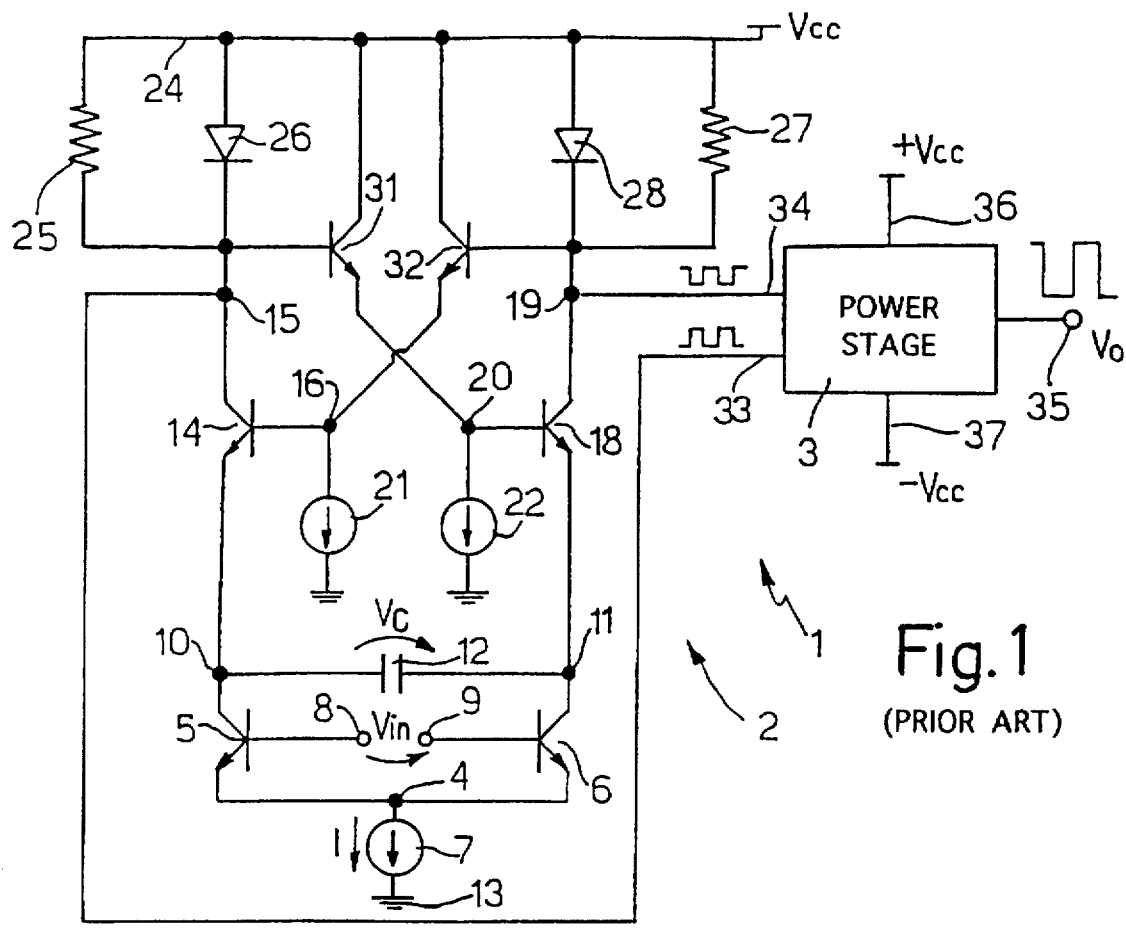
FIG. 1 shows a simplified circuit diagram of a class D amplifier.
Figure 3:
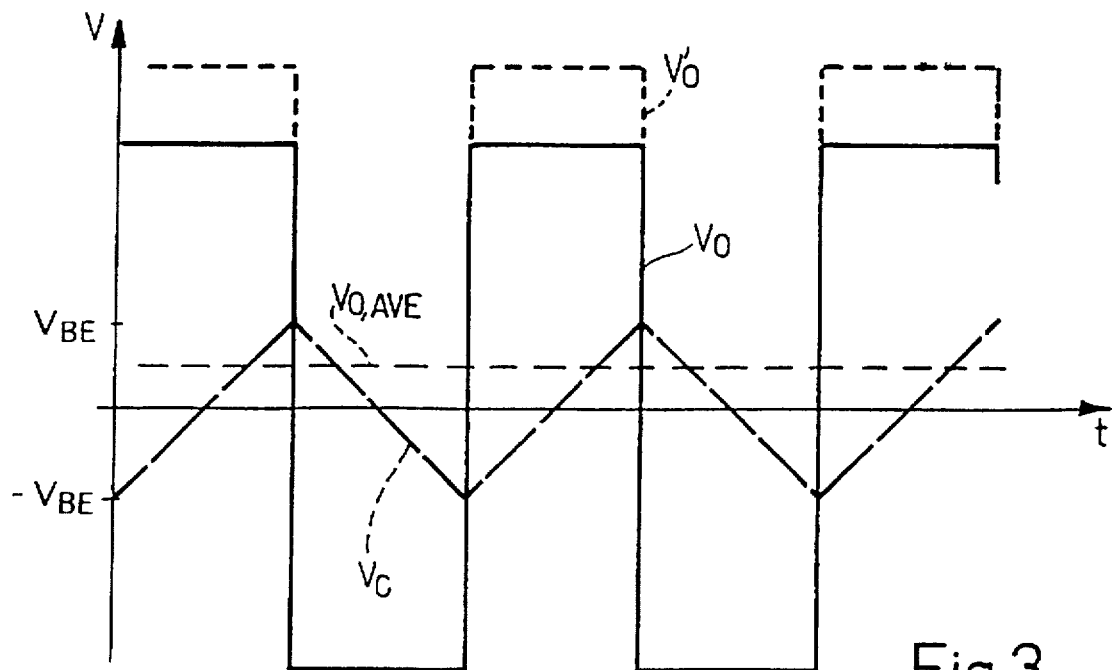
FIG. 3 shows time plot of a number of quantities in the FIG. 1 diagram.
Figure 2:
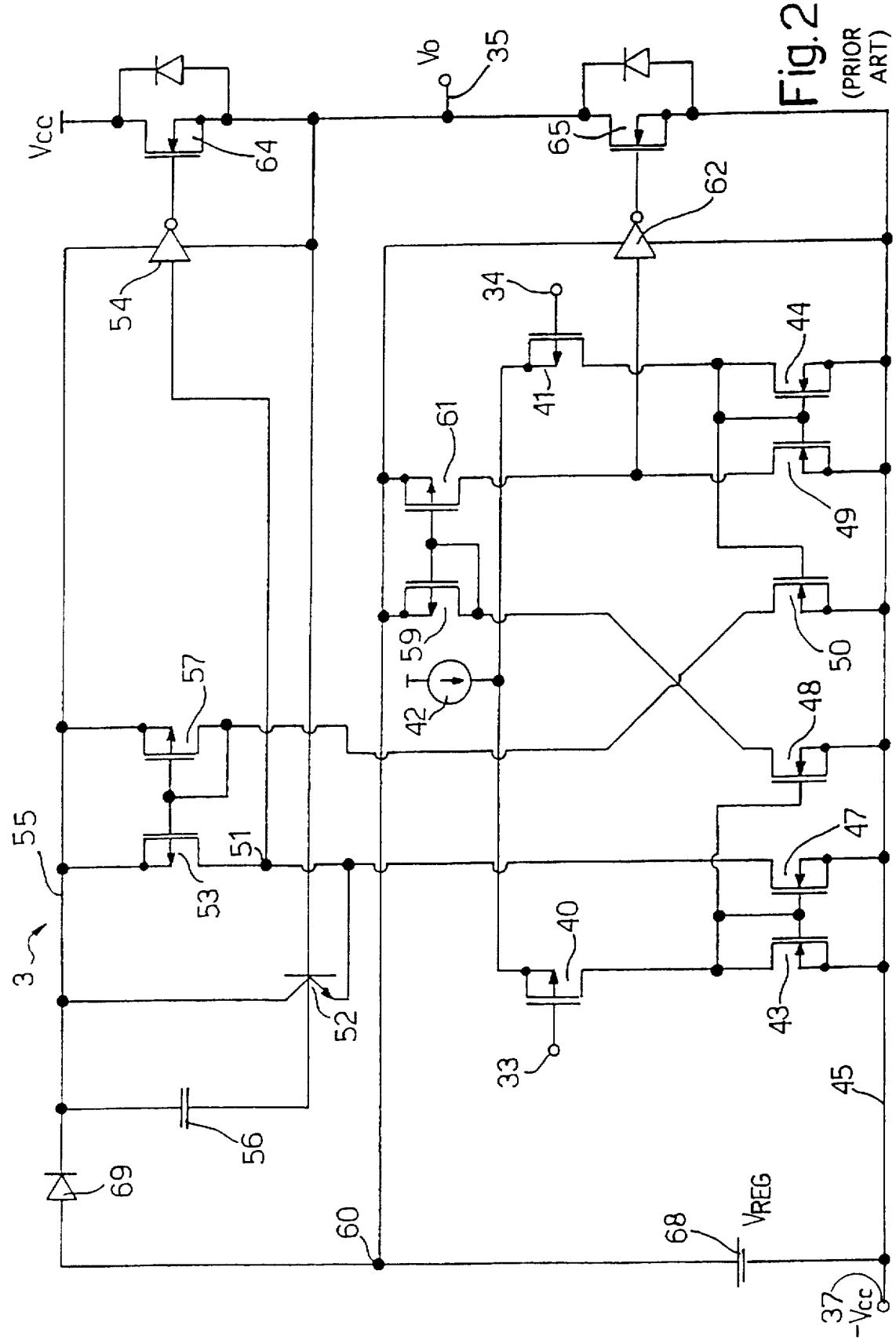
FIG. 2 shows a simplified circuit diagram of a portion of FIG. 1.
Figure 4:
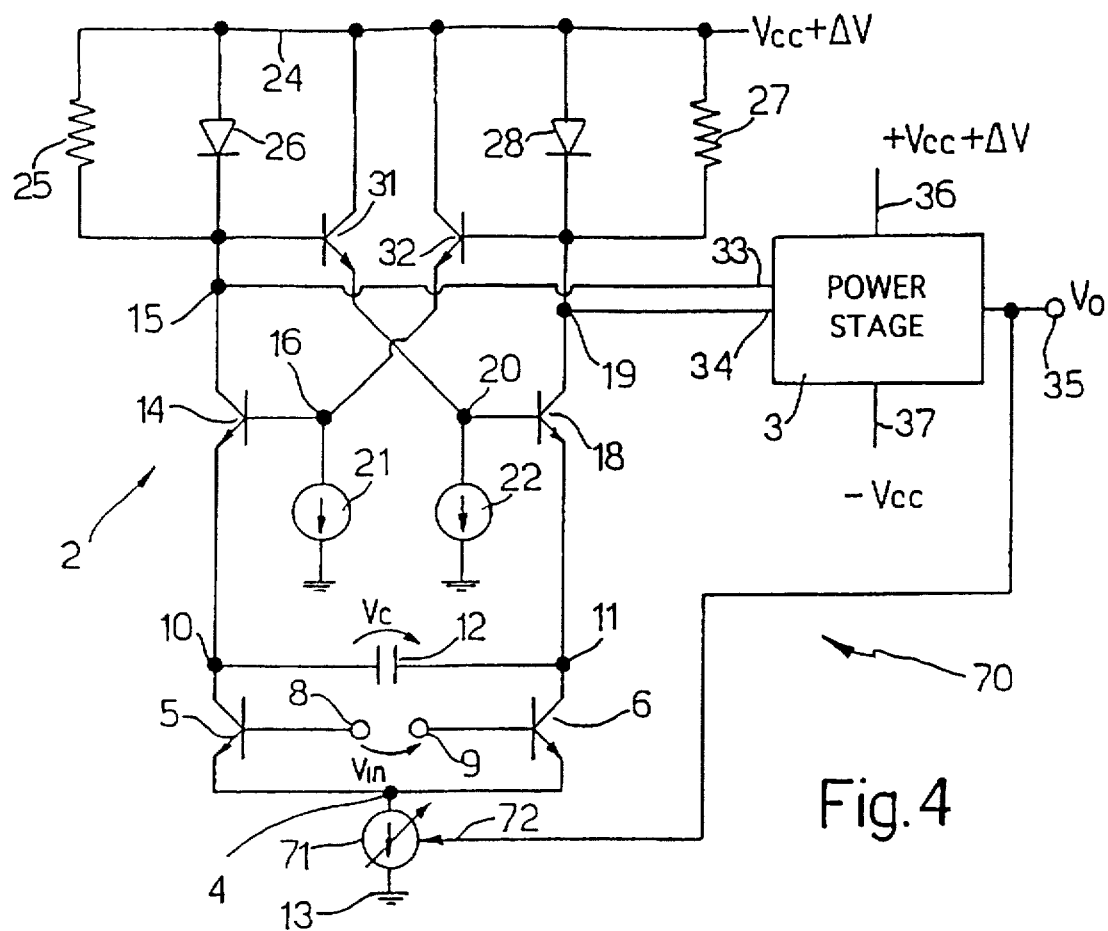
FIG. 4 show an overall circuit diagram of the amplifier according to an embodiment of the present invention.

The number 70 in FIG. 4 indicates a class D amplifier presenting the same basic structure as in FIG. 1, so that any parts common to both are indicated using the same reference numbers without further description.

According to an embodiment of the present invention, the bias current source 71 between the emitters of transistors 5 and 6 and ground line 13 is variable, and supplies an output current of a value related to the absolute value of output voltage $V_o$ of amplifier 70, SO as to vary its duty cycle. More specifically, the duty cycle is modified to produce an opposite variation in the average output voltage value to that produced by noise on one of the two supply lines, so that current source 71 presents a control input 72 connected to the output terminal 35 of amplifier 70.

Figure 5:
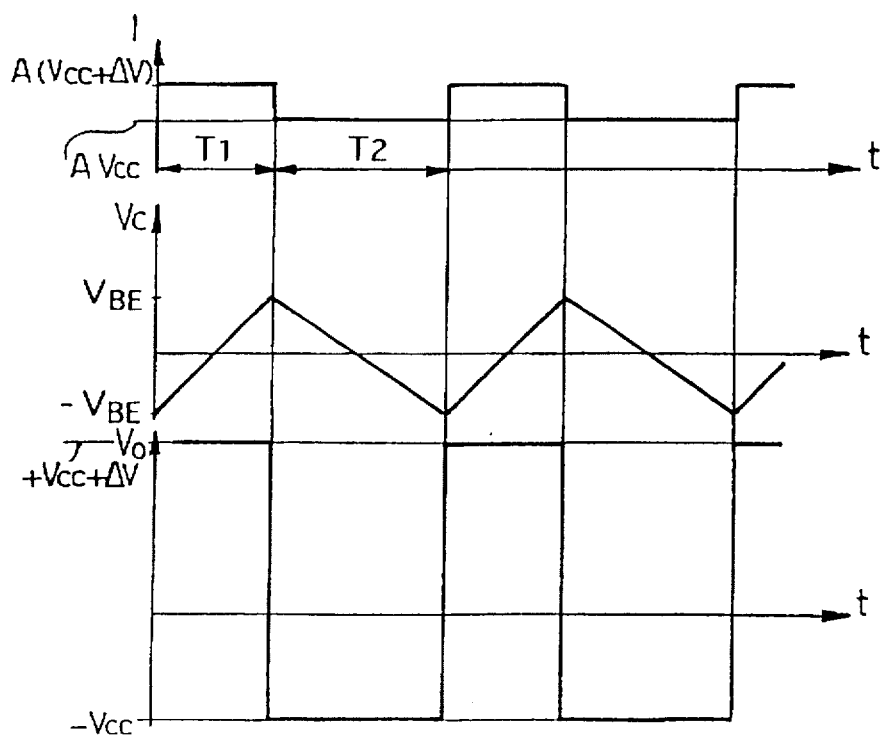
FIG. 5 shows a time plot of a number of quantities in the FIG. 4 diagram.

The voltages obtainable with the FIG. 4 circuit are shown in the FIG. 5 graph, which assumes an asymmetric supply $+V_{cc}+\Delta V$, $-V_{cc}$, so that output voltage $V_o$ switches between these two values. Current source 71 supplies an output current of $A(V_{cc}+\Delta V)$, where A is a multiplication constant, when output $V_o$ is high, and a current of $A*V_{cc}$ when output $V_o$ is low $(-V_{cc})$.

When this different value bias current is used in the two half cycles, capacitor 12 is supplied with a different current in each half cycle, and presents different charging and discharging speeds to give the triangular wave in FIG. 5, the leading (higher current) edges of which are steeper than the trailing (lower current) edges. Consequently, the duty cycle of the circuit varies, and output voltage $V_o$ presents half cycles of different length, and more specifically, a shorter half cycle $T_1$ when $V_o$ is high, and a longer half cycle $T_2$ when $V_o$ is low. Thus, the average value of output voltage $V_o$ is zero.

In fact, since each half cycle is determined by the time in which the capacitor is charged or discharged, and its voltage varies by $2V_{BE}$:

$$T_1=2V_{BE}C/[A(V_{cc}+\Delta V)] \quad (1)$$

$$T_2=2V_{BE}C/(A\,V_{cc}) \quad (2)$$

where C is the capacitance of capacitor 12. The average value $V_{o,AVE}$ of output voltage $V_o$ equals:

$$V_{o,AVE}=[(V_{cc}+\Delta V)T_1-V_{cc}T_2]/(T_1+T_2) \quad (3)$$

Substituting (1) and (2) in (3):

$$V_{o,AVE}=0$$

The circuit is therefore compensated for any asymmetrical variations in supply voltage.

Figure 6:
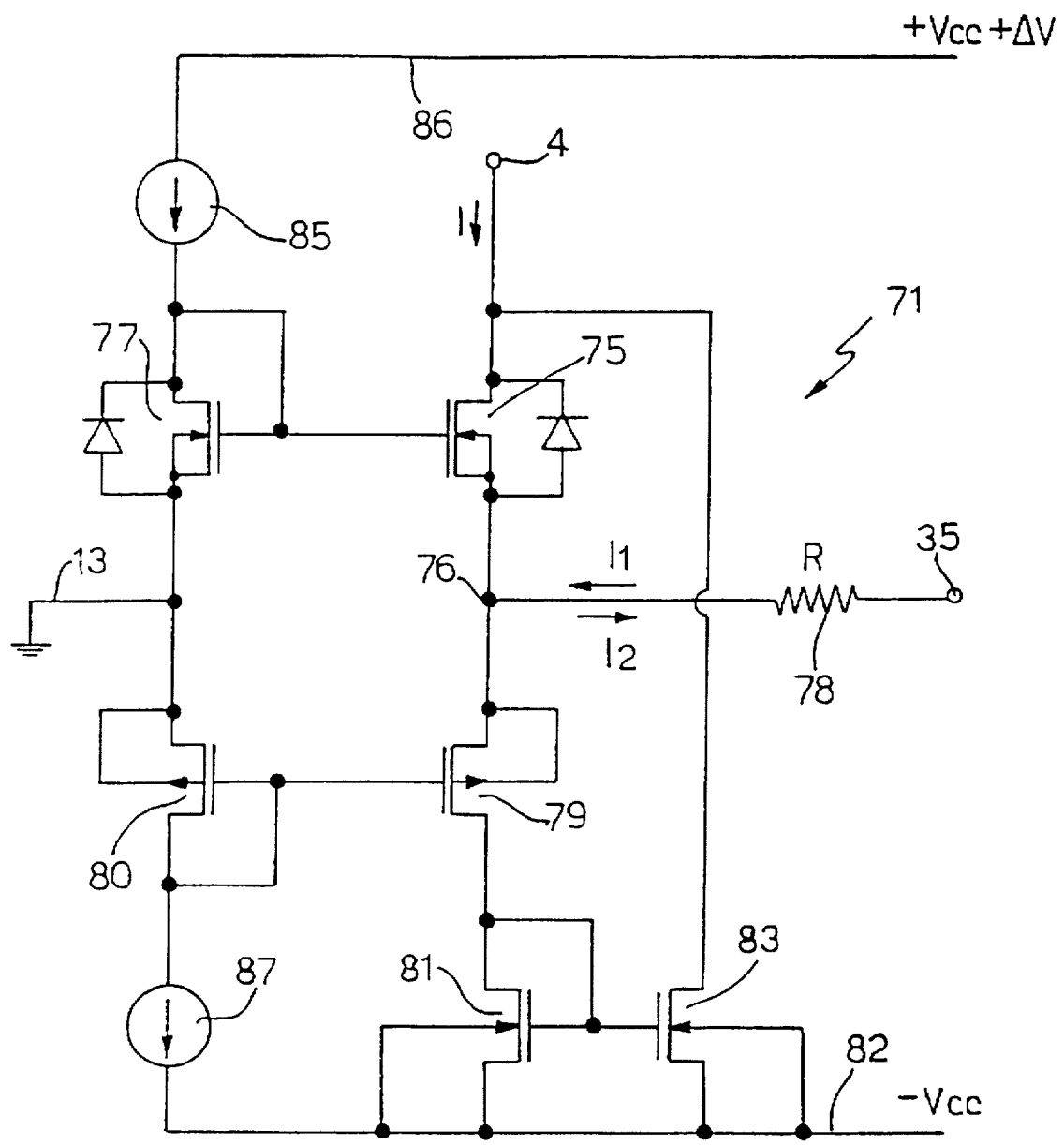
FIG. 6 shows a detailed circuit diagram of part of the FIG. 4 circuit.

One embodiment of variable current source 71 is shown in FIG. 6 and described in detail below. In FIG. 6, the node marked "4" is the same node 4 that is common to the emitters of transistors 5 and 6 as shown in FIG. 4. Node 4 is connected to the drain terminal of an N-channel MOS transistor 75, the source terminal of which is connected to node 76, and the gate terminal of which is connected to the gate terminal of a diode-connected (shorted drain and gate terminals) N-channel MOS transistor 77. Node 76 is connected to the output node 35 of amplifier 70 via a resistor 78, and to the source terminal of a P-channel MOS transistor 79. Transistor 79 has its gate terminal connected to the gate terminal of another P-channel MOS transistor 80, and its drain terminal connected to the drain terminal of a diode-connected N-channel MOS transistor 81. Transistor 81 presents its source terminal connected to a negative supply line 82 at $-V_{cc}$, and its gate terminal connected to the gate terminal of an N-channel MOS transistor 83 with which it forms a current mirror. Transistor 83 has its source terminal connected to negative supply line 82, and its drain terminal connected to node 4.

Transistor 77 has its drain terminal connected, via a bias current source 85 of value $I_b$, to a positive supply line 86 at $V_{cc}+\Delta V$, and its source terminal connected to ground line 13. Diode-connected transistor 80 has its source terminal connected to ground line 13, and its drain terminal connected to negative supply line 82 via a constant current source 87 also of value $I_b$.

Variable current source 71 operates as follows. Since transistors 77 and 75 present substantially the same gate-source voltage drop (with regard to the operating conditions of the circuit, the two voltage drops differ by only a few hundred mV, which is negligible in relation to the supply voltages of devices of this type—normally a few tens of volts or even higher), the source terminal of transistor 75 (node 76) may be assumed to be at the same potential as the source terminal of transistor 77 (ground), and the terminals of resistor 78 to present a voltage drop equal to output voltage $V_o$ of amplifier 70.

Given an initial voltage $V_o$ of $V_{cc}+\Delta V$, so that voltage $V_{cc}+V$ is present between node 35 and node 76, a current $I_1=(V_{cc}+\Delta V)/R$ from node 35 flows through resistor 78 of resistance R, and transistors 75 and 79 operate more or less as a differential circuit. More specifically, when output voltage $V_o$ is positive, the voltage at node 76 also tends to be slightly positive, so that transistor 79 is on and transistor 75 is off; and current $I_1$ flows through transistors 79 and 81, is mirrored in transistor 83, and is drawn by node 4. In this phase, current I therefore equals $I_1$ and enters the FIG. 6 circuit.

When voltage $V_o$ switches to $-V_{cc}$, voltage $V_{cc}$ is present between node 76 and node 35, so that a current $I_2=V_{cc}/R$ opposite in direction to $I_1$ (directed towards node 35) flows through resistor 78. In this phase, the voltage at node 76 tends to be slightly negative, so that transistor 75 is now on and transistor 79 off; and current $I_2$ flows through transistor 75 and is drawn by node 4. In this phase, current I therefore again enters the FIG. 6 circuit, but equals $I_2$.

In other words, source 71 in FIG. 6 generates a current $I_1$, $I_2$ proportional to the absolute value of output voltage $V_o$ of amplifier 70 in the half cycle considered, wherein proportion constant A of equations (1)–(3) in this case equals $1/R$ where R is the resistance of resistor 78.

Clearly, changes may be made to the amplifier as described and illustrated herein without, however, departing from the scope of the present invention. In particular, it should be stressed that the FIG. 6 circuit is only one of many possible implementations of the variable current source.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A single-output, dual-supply class D amplifier comprising:

an astable multivibrator stage having a signal input to receive an input signal and a signal output to supply an output signal that varies between two states;

a power stage, connected to said signal output and having an output terminal that forms a power output of said amplifier, to receive the output signal and generate an output voltage that switches between a first value and a second value, the output voltage having a duty cycle that is correlated with a value of said input signal;

wherein said amplifier is connected to first and second supply lines and a reference potential line, said first and second supply lines to provide symmetrical supply voltages in relation to said reference potential line and being subject to supply noise; and means, coupled to the power output of the amplifier, for varying said duty cycle in a manner that is correlated with said supply noise.

2. The amplifier of claim 1, wherein said astable multivibrator stage includes:

a first branch substantially in parallel with a second branch;

a current source connected to said first and second branches and generating a bias current; and a capacitor located between said first and second branches, said capacitor being charged and discharged by at least part of said bias current alternately in opposite directions, said capacitor determining a sequence of charging and discharging steps and an output signal switching step;

wherein said current source is a switchable current source that generates a current having a current value that is correlated with an instantaneous absolute value of said output voltage.

3. The amplifier of claim 2, wherein said switchable current source includes a control input connected to said power output of said amplifier.

4. The amplifier of claim 3, wherein said switchable current source further includes a differential element having an input that is connected to said power output by a resistor, the differential element having first and second terminals that are connected to a common node of said first and second branches, and having third and fourth terminals that are respectively connected to first and second bias means.

5. The amplifier of claim 4, wherein the differential element includes:

a first transistor of a first type having first and second terminals and a control terminal, said first terminal of said first transistor being connected to said common node of said first and second branches, said second terminal of said first transistor being connected to said power output, and said control terminal of said first transistor being connected to said first bias means; and a second transistor of a type that is opposite the first type having first and second terminals and a control terminal, said first terminal of said second transistor being coupled to said common node of said first and second branches, said second terminal of said second transistor being connected to said second terminal of said first transistor, and said control terminal of said second transistor being connected to said second bias means.

6. The amplifier of claim 5, wherein said first terminal of said second transistor is coupled to said common node via a current mirror circuit.

7. The amplifier of claim 5, wherein:

said first bias means includes a third transistor and said second bias means includes a fourth transistor, said third and fourth transistors being of opposite type, diode-connected, and having first and second terminals and a control terminal;

wherein said first terminal of said third transistor is connected to a first current source, said second terminal of said third transistor is connected to said reference potential line and said control terminal of said third transistor is connected to said control terminal of said first transistor; and wherein said first terminal of said fourth transistor is connected to a second current source, said second terminal of said fourth transistor is connected to said reference potential line, and said control terminal of said fourth transistor is connected to said control terminal of said second transistor.

8. The amplifier of claim 7, wherein said first and third transistors are N-channel MOS transistors, and said second and fourth transistor are P-channel MOS transistors.

9. An amplifier comprising:

an astable multivibrator circuit having a biasing current source, a first input to receive an input signal, and a pair of differential outputs to provide a first output signal that switches between a first value and a second value at a duty cycle that is based upon a value of the input signal and a bias current provided by the biasing current source; and a dual supply power amplification circuit having a first supply input to receive a first supply voltage, a second supply input to receive a second supply voltage, and a third supply input to receive a reference voltage, the first and second supply voltages being substantially symmetric about the reference voltage, the power amplification circuit having a pair of differential inputs coupled to each respective differential output of the pair of differential outputs of the multivibrator circuit and an output that provides a second output signal that switches between the first supply voltage and the second supply voltage at the duty cycle of the first output signal;

wherein the biasing current source includes a control terminal that is coupled to the output of the power amplification circuit to adjust the bias current provided by the biasing current source and modify the duty cycle of the first output signal to compensate for noise in at least one of the first and second supply voltages.

10. The amplifier of claim 9, wherein the biasing current source adjusts a magnitude of the bias current based on an absolute value of the second output signal.

11. The amplifier of claim 10, wherein the magnitude of the bias current is greater when an absolute value of the second output signal is greater and the magnitude of the bias current is lesser when the absolute value of the second output signal is lesser.

12. A circuit comprising:

a first circuit having a first input to receive an input signal, a second input to receive a bias current, and an output to provide an output signal that switches between a first value and a second value, the output signal having a duty cycle that is based upon a value of the input signal and a magnitude of the bias current; and an adjustable bias current generator coupled to the second input and to the output, to provide the bias current to the first circuit, the adjustable bias current generator adjusting the magnitude of the bias current based upon a value of the output signal;

wherein the adjustable bias current generator includes a differential current source having first and second terminals that are coupled to the second input of the first circuit, a third terminal that is coupled to a first biasing current source, a fourth terminal that is coupled to a second biasing current source, and a control terminal that is coupled to the output of the first circuit through a resistor, the differential current source providing the bias current to the first circuit from one of the first terminal and the second terminal based upon the value of the output signal.

13. The circuit of claim 12, wherein the differential current source further includes:

a first transistor having first and second terminals and a control terminal, the first terminal of the first transistor being connected to the first terminal of the differential current source, the second terminal of the first transistor being connected to the control terminal of the differential current source, and the control terminal of the first transistor being connected to the first biasing current source; and a second transistor having first and second terminals and a control terminal, the first terminal of the second transistor being coupled to the second terminal of the differential current source, the second terminal of the second transistor being connected to the control terminal of the differential current source, and the control terminal of the second transistor being connected to the second biasing current source.

14. The circuit of claim 13, wherein the first terminal of the second transistor is coupled to the second terminal of the differential current source through a current mirroring circuit.

15. The circuit of claim 13, wherein the first and second biasing current sources each include a diode-connected transistor that is coupled to a fixed current source, each diode-connected transistor having first, second, and control terminals, the first terminal of a respective diode-connected transistor being connected to a respective fixed current source, the second terminal of the respective diode-connected transistor being connected to a reference potential terminal, and the control terminal of the respective diode-connected transistor being connected to the control terminal of one of the first and second transistors, respectively.

16. A method for producing an output signal that varies based upon a value of an input signal, the method comprising the steps of:

generating a first signal that switches between two values, the first signal having a first duty cycle that is dependent upon the value of the input signal;

generating the output signal based upon the first signal, the output signal switching between first and second signal levels and having a duty cycle that is substantially equal to the first duty cycle, the first signal level being related to a first supply voltage, and the second level being related to a second supply voltage; and adjusting the first duty cycle based on variations in the first and second supply voltages.

17. The method of claim 16, wherein the step of adjusting includes a step of adjusting the first duty cycle to average the output signal to a signal level that is substantially equal to an average of the first and second signal levels when the value of the input signal is zero.

18. The method of claim 16, wherein the step of generating the first signal includes steps of:

charging a capacitor to a first voltage to generate the first signal having a first of the two values; and discharging the capacitor to a second voltage to generate the first signal having a second of the two values.

19. The method of claim 18, wherein the step of adjusting includes a step of altering a duration of the step of charging.

20. The method of claim 18, wherein:

the step of charging the capacitor includes a step of charging the capacitor using a first current, the step of charging having a first duration that is based upon a magnitude of the first current and the value of the input signal; and the step of discharging the capacitor includes a step of discharging the capacitor using a second current, the step of charging having a second duration that is based upon a magnitude of the second current and the value of the input signal.

21. The method of claim 20, wherein the step of adjusting includes a step of modifying the magnitude of the first current to adjust the first duration.

22. The method of claim 20, wherein the step of adjusting includes a step of modifying the magnitude of the first current to average the output signal to a signal level that is substantially equal to an average of the first and second signal levels when the value of the input signal is zero.

23. A circuit for producing an output signal that varies based upon a value of an input signal, the circuit comprising:

an astable multivibrator circuit having a first input to receive the input signal, a second input to receive a bias current, and a first output to provide an intermediate signal that switches between a first value and a second value, the intermediate signal having a duty cycle that is based upon a value of the input signal and the bias current;

a dual supply amplifier coupled to the first output of the multivibrator circuit to receive the intermediate signal and produce the output signal on an output of the amplifier, the output signal switching between a first signal level and a second signal level at the duty cycle of the intermediate signal and having an average value, the first signal level being related to a first supply voltage and the second signal level being related to a second supply voltage; and means, coupled to the second input of the multivibrator circuit and the output of the amplifier, for modifying the duty cycle of the intermediate signal to adjust the average value of the output signal so that it is independent of noise on at least one of the first and second supply voltages.

24. The circuit of claim 23, wherein the means for modifying includes an adjustable current source that adjusts a magnitude of the bias current provided to the second input of the multivibrator circuit.

25. The circuit of claim 24, wherein the adjustable current source adjusts the magnitude of the bias current based upon an absolute value of the output signal.

26. The circuit of claim 24, wherein the adjustable current source alternately provides one of a first bias current and a second bias current to the second input of the multivibrator circuit dependent upon the first signal level and the second signal level, respectively.

* * * * *